United States Patent
Kennefick

(10) Patent No.: US 9,026,407 B1
(45) Date of Patent: May 5, 2015

(54) METHOD OF MAKING AND USING A MATERIAL MODEL OF ELEMENTS WITH PLANAR FACES

(71) Applicant: Christine Marie Kennefick, Reston, VA (US)

(72) Inventor: Christine Marie Kennefick, Reston, VA (US)

( * ) Notice: Subject to any disclaimer, the term of this patent is extended or adjusted under 35 U.S.C. 154(b) by 0 days.

(21) Appl. No.: 14/516,536

(22) Filed: Oct. 16, 2014

(51) Int. Cl.
*G06T 19/20* (2011.01)
*G06T 17/00* (2006.01)
*G06F 17/50* (2006.01)

(52) U.S. Cl.
CPC .............. *G06T 19/20* (2013.01); *G06F 17/5009* (2013.01); *G06T 17/00* (2013.01)

(58) Field of Classification Search
CPC ..... G06F 17/5009; G06T 17/20; G06T 17/00; G06T 19/20
USPC .......................................................... 703/1
See application file for complete search history.

(56) References Cited

U.S. PATENT DOCUMENTS

| | | | |
|---|---|---|---|
| 3,724,951 A | 4/1973 | Seelbinder | |
| 5,768,156 A | 6/1998 | Tautges et al. | |
| 5,826,213 A | 10/1998 | Kennefick | |
| 6,157,747 A * | 12/2000 | Szeliski et al. | 382/284 |
| 6,847,925 B2 | 1/2005 | Ottusch et al. | |
| 6,937,967 B2 | 8/2005 | Hines et al. | |
| 6,983,226 B2 | 1/2006 | Kennefick | |
| 7,363,198 B2 | 4/2008 | Balaniuk et al. | |
| 7,403,879 B2 | 7/2008 | Placko et al. | |
| 7,493,243 B2 | 2/2009 | Choi et al. | |
| 7,499,841 B2 | 3/2009 | Hoffman | |
| 7,576,353 B2 | 8/2009 | Diduck et al. | |
| 7,801,688 B2 | 9/2010 | Brokaw et al. | |
| 7,813,160 B2 | 10/2010 | Drndic et al. | |
| 8,093,786 B2 | 1/2012 | Shi et al. | |
| 8,094,156 B2 * | 1/2012 | Smith | 345/473 |
| 8,097,456 B2 | 1/2012 | Borenstein et al. | |
| 8,119,271 B1 | 2/2012 | Bruce et al. | |
| 8,124,966 B2 | 2/2012 | Lazarev | |
| 8,208,776 B2 | 6/2012 | Tokushima | |
| 8,426,077 B2 | 4/2013 | Norby et al. | |

(Continued)

OTHER PUBLICATIONS

C. M. Kennefick, C. E. Patillo, T. Kupoluyi and C. A. Gomes, 2011, A Computer Simulation of Grain Orientation and Aspect Ratio that Promotes the Reflection of a Pressure Wave by Elastic Rotational Stress, Shock Waves, 21 [1] pp. 63-70.

(Continued)

*Primary Examiner* — Aniss Chad

(57) ABSTRACT

A method of making and using a material model utilizes summation, integration or alteration of force, stress, energy or sets of flux vectors that vary across or emanate from three dimensional elements with planar faces. The method receives input from a user to set up one or more three dimensional elements without further division, addition, merging or distortion. Processor steps detect and compute limits of integration across a face nearest a sampling point in coordinate systems local to the face and local to a plane of rotation for any rotation within a material matrix. Patterns of force, stress, energy or sets of flux vectors from a model can be utilized to promote electrical conduction not facilitated by a traditional voltage, detection of properties of an incoming wave, resistance against fracture, or selective separation of material.

2 Claims, 15 Drawing Sheets

(56) References Cited

U.S. PATENT DOCUMENTS

| | | | |
|---|---|---|---|
| 8,582,397 | B2 | 11/2013 | Raghavan et al. |
| 8,629,572 | B1 | 1/2014 | Phillips |
| 8,643,280 | B2 | 2/2014 | Heil et al. |
| 8,679,373 | B2 | 3/2014 | Nagel |
| 8,687,920 | B2 * | 4/2014 | Morel et al. .......... 382/296 |
| 8,699,249 | B1 | 4/2014 | Chen |
| 8,775,134 | B2 | 7/2014 | Gielis |
| 8,953,937 | B2 | 2/2015 | Sartorius et al. |
| 2006/0111887 | A1 | 5/2006 | Takeuchi et al. |
| 2009/0102837 | A1 | 4/2009 | Kang et al. |
| 2009/0315885 | A1 | 12/2009 | Baszucki |
| 2011/0295579 | A1 | 12/2011 | Tang et al. |
| 2013/0311450 | A1 | 11/2013 | Ramani et al. |
| 2014/0125663 | A1 | 5/2014 | Zhang et al. |
| 2014/0278294 | A1 | 9/2014 | Yeager et al. |

OTHER PUBLICATIONS

M. M. Abubakar, A. D. Getahun and C. M. Kennefick, 2010, A Computer Simulation of Strain Energy from Rotation to Promote Protonic Conduction across Grain Boundaries, Physica B 405 [5], pp. 1437-1446.

A. U. Andy, A. T. Abayomi and C.M. Kennefick, 2010, A Computer Model of the Annihilation of the Electric Field in an Electromagnetic Wave by the Elastic Stress Field of a Rotated Grain, Int. J. of Applied Electromagnetics and Mechanics, 32, pp. 133-143.

C. M. Kennefick, 2010, An Analysis and Computer Simulation of Utilizing Strain Energy to Promote Superconductivity, International Journal of Engineering Science, 48 [12], pp. 1872-1880.

C. M. Kennefick, 2009, The Elastic Displacement and Stress in a Material to Promote Reflection and Transmission of an Incoming Wave, Int. J. Mechanics and Materials in Design, vol. 1, Issue 1, p. 1.

* cited by examiner

METHOD OF MAKING AND USING A MATERIAL MODEL OF ELEMENTS WITH PLANAR FACES

BACKGROUND OF THE INVENTION

Technical Field

The field of the invention encompasses processor steps, methods for computing devices, electrical power, electrical conduction, wave characterization, resistance to fracture and selective fracture.

Technical Problem

Materials are comprised of intricate micro structural elements that can include phases, grains, atomic planes and atomic clusters. To model materials to promote new forms of electrical conduction, signal collection and transmission, and mechanical integrity, physical quantities such as waves, energy patterns and stress patterns must be built, analyzed and calculated between and inside such intricate elements.

Advantageous Effects of the Invention

One advantage of the method is that it works with elements with any of several symmetries and with internal angles and dimensions intricately set by a user to promote a desired physical quantity inside or outside the elements. There is no added step of subdividing the material elements into other elements, meshes or grids.

When there is rotation of one or more elements inside a material matrix, processor steps can compute the angle of rotation directly from applied stresses, or allow a user to input an angle directly. In addition, the method allows a user to place pivot points of rotation in the center or at another point in each element.

A third advantage is that processor steps can set up limits of summation, integration or alteration of patterns of flux vectors in local coordinate systems across a face of an element nearest a sampling point. Processor steps detect both a vertex and face nearest a sampling point.

The method sets up a local coordinate system for each face with a vertical axis perpendicular to the plane of the face. When there is rotation of an element inside a material matrix, one axis of the local coordinate system in the plane of the face can be at the intersection of a plane of rotation and the plane of the face. In these local coordinate systems, the method detects edges that are upper and lower boundaries for mathematical integration and detects the vertices where these boundaries change.

Finally, the method facilitates design inside a monolithic portion of material. Mathematical representation of atomic clusters or other small entities can be placed at the vertices, edges or in the interior of the elements.

Related Art

A method builds an initial configuration of one or more three dimensional elements with planar sides and with dimensions, interior angles, orientation and spacing as inputted by a user without further division, merging, mesh generation or distortion. Other methods encompassing three dimensions search for and retrieve objects already stored in a database, merge or move meshes and objects, or create curved contours and surfaces. Examples of these latter methods include those of Choi, Min Gyu and Ko, Hyeong Seok, U.S. Pat. No. 7,493,243, Placko, Dominique Marc, et. al., U.S. Pat. No. 7,403,879, Ottusch, John Jacob, et. al., U.S. Pat. No. 6,847,925, Ramani, et. al., U.S. Patent Application 2013/0311450, Yeager, et. al., U.S. Patent Application 2014/0278294, Tautges, et. al., U.S. Pat. No. 5,768,156, Baszucki, U.S. Patent Application 2009/0315885, Balaniuk, Remis, et. al., U.S. Pat. No. 7,363,198, Kang, et. al., U.S. Patent Application 2009/0102837, Tang, et. al. U.S. Patent Application 2011/0295579 and Zhang, et. al., U.S. Patent Application 2014/0125663.

The method of steps includes building a model of material elements that can be sheared along edges, faces or within their volume and does not require input, signals or material properties directly from an experimental apparatus. Other methods, in contrast, model elements of space (Takeuchi, Kazuhiro and Nagakura, Masahiro, U.S. Patent Application 2006/0111887), include heating and cooling (Nagel, Christopher J., U.S. Pat. No. 8,979,373) or include material properties from test data (Hoffman, Edward L., U.S. Pat. No. 7,499,841).

The material model in this invention does not encompass substrates, epitaxial layers and lithography. Other inventions, in contrast, work with ordered epitaxial layers of nanodots and nanorods (Goyal, Amit, U.S. Pat. No. 8,119,571), arrays of nanodots (Drndic, Marija and Fischbein, Michael D., U.S. Pat. No. 7,813,160) and the adhesion of cells on a substrate (Borenstein, Jeffrey P., Carter, David and Vacanti, Joseph P., U.S. Pat. No. 8,097,456).

The interaction between the wavelike nature of charge carriers and potential energy patterns that are not voltages in the model is in contrast to other inventions that utilize a voltage to drive electrical conduction. Examples of utilizing voltages include piezoelectric conduction (Shi, Yong and Xu, Shiyou, U.S. Pat. No. 8,093,786), anisotropic semiconduction (Lazarov, Pavel I., U.S. Pat. No. 8,124,966). harmonic radio frequencies of voltage (Heil, Brian George, et. al., U.S. Pat. No. 8,643,280), and solid state circuitry to reduce voltage drops (Chen, Ping, U.S. Pat. No. 8,699,249).

This model also supports guidance of energy by defining material micro structures as groups of energy flux vectors. A path and pattern of flux vectors can be determined by the twist and rotation of atomic clusters, grains, or even other groups of flux vectors. Such a model is in contrast with other methods that include incorporation of specific ions into the atomic lattice (Norby, Truls, et. al., U.S. Pat. No. 8,426,077), reflection and recombination of waves to produce regions of high intensity (Rhaghavan, Raghu and Poston, Timothy, U.S. Pat. No. 8,582,397), placement of small capacitors and inductors and use of an electric field (Diduck, Quentin and Margala, Martin, U.S. Pat. No. 7,576,353) and compression of magnets to produce linear Faraday induction (Phillips, Reed E., U.S. Pat. No. 8,629,572).

SUMMARY OF THE INVENTION

A method of making and using a material model utilizes one or more three dimensional elements with planar faces. The elements can represent grains, parts of material phases, or lattices for atomic clusters that would exist inside a monolithic portion of a material. The method builds the model by summation, integration or alteration of quantities across or through the faces to produce a unique pattern of a desired physical quantity that can be outside or inside the elements. Processor steps set up local coordinate systems for each face in which the origin is in the plane of the face and one axis is perpendicular to the plane of the face. When there is rotation of an element inside a material matrix, processor steps can also set up one axis of the local coordinate system to be at the intersection of a plane of rotation and the plane of the face. Upper, lower, left and right limits of integration are detected and computed in a local coordinate system, as well as a presence of other interacting elements within a sphere of selected size about each element. The desired physical quantity in the model, which can be utilized in a device, can include conditions for electrical conduction not requiring a traditional voltage, conditions for detecting properties of a wave, or criteria for structural integrity or selective separation of material.

BRIEF DESCRIPTION OF THE DRAWINGS

Reference will be made to the accompanying drawings, which can represent any length scale from the atomic to continuum levels.

DESCRIPTION

Figure 1A:
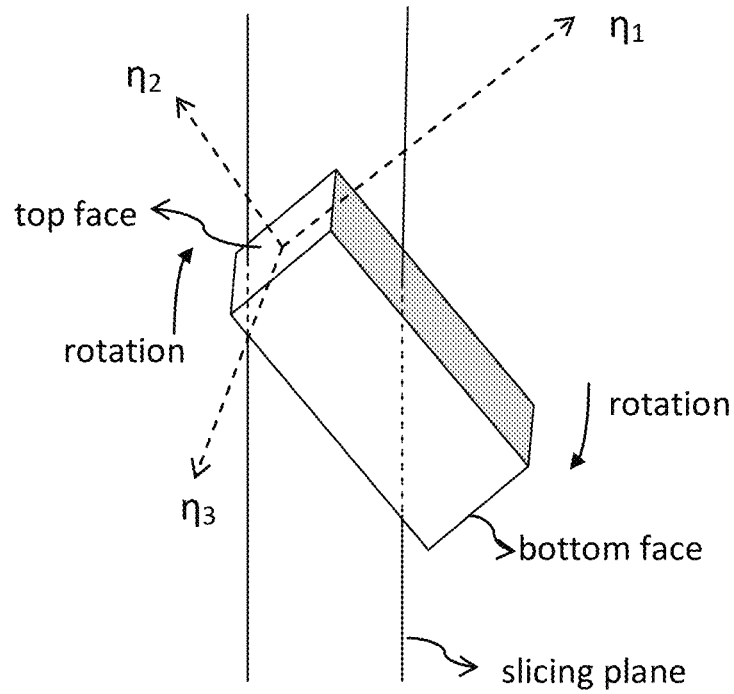
FIG. 1a shows a plane of rotation slicing a three dimensional element, with the $\eta_1$ direction at the intersection of the slicing plane and the top face of the element.
Figure 6:
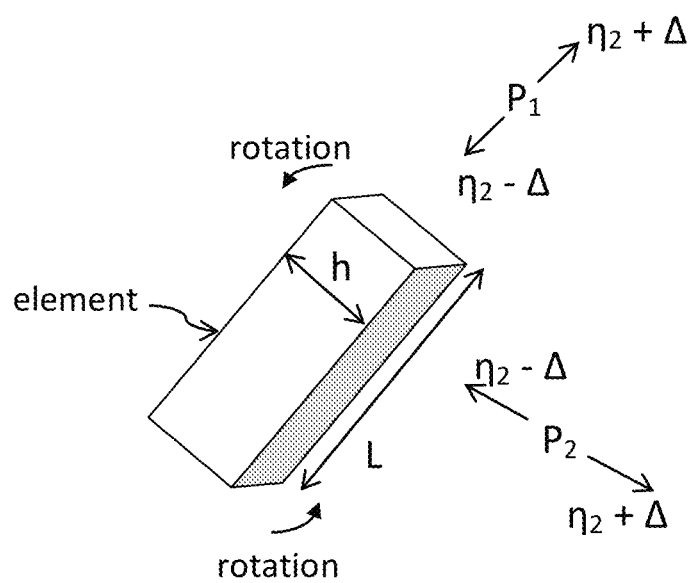
FIG. 6 shows the movement of a point P from up and down in the $\eta_2$ direction to determine the overall dimension h that will produce the desired variation of a physical characteristic calculated at P.

This description makes reference to the following terms:

alteration—a rotation or change of direction of one or more flux vectors in a plurality of flux vectors representing force, stress, energy or a change in energy.

attributes—basic characteristics of an element, including but not limited to its symmetry, width, depth, length, orientation, presence or absence of endcaps, bundling and tapering, rotational angle, number and distance of any interacting elements around it bottom face—Before an element is oriented in space, it is a face of an element in the lowest position, or perpendicular to a vertical or y axis in an x, y, z coordinate system. A bottom face is illustrated in FIG. 1a. If pyramidal endcaps are present, the bottom face is virtual and inside the element, but is the face from which the height of the bottom endcap is measured. Whether or not pyramidal endcaps are present, the bottom face is one face from which the length L of the element is measured. A length L is illustrated in FIG. 6.

bundled—sharing a face with at least one other element. The shared face remains intact and belongs to each element sharing the face. The elements do not merge together. A straight line runs through the virtual center of mass of the shared faces of all the elements in a particular bundle.

ceramic—a material with primarily covalent or ionic bonding between atoms and in which bonding electrons are not as delocalized as they are in metallic bonding. Materials in this class can be comprised of lighter mass atomic elements such as boron, carbon, silicon and nitrogen. Many have lower mass densities than metals and a higher resistance to heat than polymers. They are used in aircraft and high temperature applications. In its broadest interpretation, ceramics include materials that are not metals or polymers: aircraft materials, semiconductors, electro ceramics, high temperature structural ceramics and clay.

closed form—describes a solution to an equation or integration process that is a function of one or more variables. When a function cannot be obtained in closed form, other mathematical techniques utilizing infinite series or numerical integration, for example, are used to obtain a solution to a problem at hand.

crack tip—a place in which two free surfaces of a crack come together where there is still intact material. A crack can propagate then strain energy is released during fracture of a material.

cubic—having four threefold axes of symmetry. It could be a cube, an octahedron or another shape.

depth—a dimension of an element measured from a vertex farthest in front to a vertex farthest in back of an unoriented element.

dimensions—collectively the width, depth, length, and if any pyramidal endcaps present, a pyramid cap height.

data container—a place in the memory of a computing device where data is stored. The container is general in that it can be a place inside a variable structure where an attribute is stored, a position in the memory architecture itself, or it can be a cell or position in an array or vector, for example.

elastic—pertaining to a point that after a displacement can return to its original position after a force is removed. Under stress low enough for a particular material, the material is elastic, just as rubber band is elastic, with a rubber band exhibiting much more strain.

elastic strain energy—a potential energy built up when a material undergoes elastic strain. The strain energy per unit volume is a product of elastic stress and strain. If elastic strain energy does not disappear when a stress is removed and the energy is built up far enough, it can be released during fracture of a material.

edge—a line segment where two faces meet on an element.

endcap—a pyramid that extends from the top and bottom faces of an element element—a three dimensional portion of a lattice of points used for building a model for material matter. It has planar faces and pertains to a solid in that its edges, faces, a plane within the element, or its entire volume may be sheared. It can have fluid inside or outside, but at least its edges or faces can undergo shear. Its vertices are a part of a material lattice. It is not a geometric shape formed as part of a mesh or grid. Its vertices could be the positions of atoms, atomic clusters, or electron waves. In other embodiments, a element could be an entire grain or part of a phase of a material.

energy—a general term here that includes potential energy, electrical energy and kinetic energy.

face—a planar facet on the surface of an element. The terms face and facet are interchangeable here. A facet is where a plane intersects the surface of an element, leaving an enclosed area bounded by edges and vertices. The edges bounding the enclosed area form a square, rectangle, triangle, parallelogram, hexagon or another shape as the symmetry of the element requires.

flux vector—a vector passing through a unit of area. It can have a magnitude representing force, stress, kinetic energy or a change in potential energy. It can have a direction of force, velocity or a change in potential energy.

grain—a single crystallite of material in which atomic planes are continuously aligned and the grain itself has a particular symmetry. A material is comprised of grains bonded to each other and in which there is a change in orientation of atomic planes from one grain to the next. Schematically, the elements in each of FIGS. 1*a*, 6, 7, 8, 9 and 13 can depict a grain.

hexagonal—having a sixfold axis of symmetry.

interior angles—an angle formed in the interior of an element where two faces meet.

index—a label or tag indicating a position in a data container to store a piece of data integration—a mathematical process in taking a limit of a sum to form an integral.

length—The dimension along an edge of an element that, when a top and bottom face are present, extends from the top face to the bottom face. When there are pyramidal endcaps present, the top and bottom faces are virtual and are at the base of the pyramids. The length in this case, as inputted by a user, is still measured between the virtual top and bottom faces. A total length from one apex to the next would be obtained by adding to the basic length the pyramid cap heights at the ends of the capped element. For an octahedron, the length is measured between two vertices along a line through the center of the octahedron.

material—matter that can be subjected to shear. A material can be of any of a number of types including ceramic, metal, polymer or wood.

material matrix—When a particular grain or plurality of particles is described in a material, the surrounding material is often referred to as the material matrix. It is not a grid or mesh, but simply the solid material within which an element or plurality of elements are embedded.

metal—a type of material in which the outermost electrons around the atoms in the material are loosely bonded, delocalized and can promote electrical conduction under a voltage.

monoclinic—having a single mirror plane.

monolithic—a general term here that means that a composite material does not have deposited layers or nanotubes. It refers to a material does not have dots, lines, or a geometrical pattern of another material or device specifically deposited on its surface. In this method, the term monolithic, however, includes alloys, composites, single unalloyed materials, or single materials containing more than one solid phase.

number—a number denoting the quantity of elements that a user inputs for analysis numerical integration—a mathematical summation process that is performed when an integration cannot yield a function in closed form orthorhombic—pertaining to an element in which the width, length and depth are all different but for which the axes along the edges are at right angles to each other. A rectangular brick used for building has orthorhombic symmetry.

orientation—the angular position of a element after being rotated into place about the z, x and y axes in a Cartesian coordinate system.

pattern—a geometric configuration formed by the magnitude and direction of a plurality of flux vectors.

phase—refers most often here as a phase of a material, which is a state of material with its own symmetry and structure. Just as ice and steam are different phases of water, a solid material can have different solid phases which have the same chemical composition but which have grains of different symmetry. When the term phase is used to describe a mathematical equation, it is a phase angle, or angular offset of a sine or cosine function.

physical quantity—an entity of interest computed at a sampling point. It could be a single numerical value or a mathematical function describing a wave or a property of a material.

planar faces—facets on the surface of an element that in a material model are flat or contained in planes.

pyramidal endcap—an extension on an element comprised of a vertex and triangular faces. When pyramidal endcaps are present they extend from and are attached to the top and bottom faces at the ends of the length of an element. Both the element in FIG. 7 and element 4 in FIG. 11 have pyramidal endcaps.

pyramid cap height—the length dimension from the virtual center-of-mass of the face upon which a pyramidal endcap sits to the apex of pyramid. The cap height is inputted by a user as a fraction of the length of an element.

radius of interaction—When defined as nonzero by a user, it is a radius of a virtual sphere about each element. If the virtual center-of-mass of another element is located within this sphere, the two elements can interact in a manner defined by the user.

rotation—a rotation caused by a force inside a material. The rotation is stopped by a backstress inside the material in attempt to keep an element in an equilibrium position. The angle of rotation can be as small as a millionth of a radian or as large as one radian. It is not the rotation a user might think about to orient an element before an analysis begins.

rotation axis—an axis about which an element rotates sampling point—a point where a desired calculation is performed or a desired physical quantity will be within the sphere of analysis selective separation—a pulling apart, breakage or fracture at a particular desired place within an element or between two elements.

shape—a property of an element that collectively refers to its symmetry and any pyramidal endcaps and tapering that may be present.

shear—pertaining to a force acting parallel to a plane of material rather than perpendicular to the plane of material.

size—a general term pertaining to an element that collectively refers to length, width and depth sphere of analysis—a virtual sphere about a probe point that contains one or more sampling points strain—a dimensionless quantity that describes relative displacement of a point in a material. Different formulae can be used to calculate strain. It can simply be the amount of elongation or compression of an object divided by its total length in the direction of the elongation or compression. Other strain is defined by formulae such as $\partial u/\partial x$, where u is a amount of displacement in an x coordinate direction. Shear strain is defined in a similar manner for displacements across a plane of material, with the result being an angle.

strain energy—a potential energy that arises from a product between stress and strain. If strain energy becomes too large, fracture or plastic deformation can occur.

stress—a force per unit area symmetry—a property of an element pertaining to operations such as a rotation and reflection that leave the element unchanged. Symmetry can include, for example, a twofold, threefold, or fourfold axes for rotation or a mirror plane for reflection.

tapering—describes an element whose area of the bottom face is a fraction of that of the top face. The element is then said to be tapered along its length toward the bottom face. The amount of tapering is defined when a user inputs the desired area of the bottom face as a fraction of the area of the top face.

tension—a type of stress in which a force acts perpendicular to a plane of material. Tension acts to pull apart in the direction of the force, whereas compression acts to press it together in the direction of the force.

tessellation—a process of dividing and covering an area with smaller areas of triangular shape or other shape. The smaller areas are contiguous to one another with no space between them. The method here does not tessellate the faces of an element.

tetragonal—having a fourfold axis of symmetry. An element having a fourfold axis of symmetry can be rotated 90 degrees about the fourfold axis and look identical.

top face—Before an element is oriented in space, a face of an element in the highest position, or perpendicular to a vertical or y axis in an x, y, z coordinate system. A top face is illustrated in FIG. 1a. If pyramidal endcaps are present, the bottom face is virtual and inside the element, but is the face from which the height of the bottom endcap is measured. Whether or not pyramidal endcaps are present, the bottom face is one face from which the length L of the element is measured. A length L is illustrated in FIG. 6.

trigonal—having a threefold axis of symmetry. When a user denotes an element as trigonal, the top and bottom faces can be outlined by equilateral triangles.

unbundled—a single element or a plurality of elements in which no faces are shared. When there is a plurality of elements, two or more elements can be unbundled and still share a vertex or edge.

vertex—a point at a corner of an element where three or more edges meet.

virtual center-of-mass—In visual terms, the geometrical center of a face or grain. If a face were acted upon by a force, its motion would be such that masses at the vertices of the face or element could be concentrated at the position called the center of mass. The term center-of-mass is used rather than simply "center" because the position must be defined and calculated within oblique triangles as well as rectangles and squares. The term virtual is used because an element or face in a material model might not have mass exactly at the vertices, but along edges or concentrated off-center within an element.

vector—When it is specifically mentioned in the description of this invention, it is a mathematical variable having both a direction and magnitude. The invention also includes the term vector as a specific type of data container in the C++ programming language.

width—the horizontal dimensional vertex-to-vertex on a top or bottom face of an element. See the terms vertex, face and element in this glossary for further definitions.

I. Elements

The invention is a method of making and using a material model of one or more micro structural elements in which a desired quantity within the model is determined by a summation, integration or alteration from a pattern of other physical quantities across or through the faces of the elements. The elements here refer to atomic clusters, grains, particles or phases that could comprise the material model as a whole or as a texture embedded in another material matrix, and will be referred to as micro structural elements, or elements, for short. The elements in the model are three dimensional and have planar faces.

It is a monolithic material model in the sense that to fabricate a material from the model, one does not need to deposit layers, dots, lines or devices onto a substrate material. The micro structural elements comprising the model can be contiguous to one another, or linked to one another vertex-to-vertex, or edge-to-edge within a model matrix material. The micro structural elements can also be completely separated from one another and comprise a pattern embedded in a model matrix material. It is the intent, however, that fabrication of a material from the invention, will not involve deposition of layers or lithography techniques.

Buildup of the model comprises summation, numerical integration, integration in closed form, or direct alteration of forces or energies and can further comprise rotation to produce the desired force or energy pattern around or within the elements. In what follows, an example of the buildup of a model by defining a convenient coordinate system and performing numerical integration to produce the desired pattern of micro structural elements is given.

II. Rotation

IIA. Plane of Rotation

In one embodiment, rotation occurs within a material matrix and can produce a combination of elastic shear, tension, or compression at a face of an element. FIG. 1a, for example, shows a plane of rotation slicing an upper face of an element to produce a local coordinate system to analyze the elastic stresses from rotation. The rotation axis can be at any orientation with respect to an element and have a pivot point at the center of mass or at any other place on or in the element. Planes of circular rotation, however, will be perpendicular to the rotation axis and can "slice" a particular face, as shown in FIG. 1a.

In FIG. 1a, the intersection of a plane of rotation and the plane containing the top face is a line that contains an $\eta_1$ axis. The $\eta_1$ axis is part of an orthogonal $\eta_1$, $\eta_2$, $\eta_3$ coordinate system in which the $\eta_2$ direction is normal to the face. The $\eta_3$ direction lies in the plane of the face and is perpendicular to both the $\eta_1$ and $\eta_2$ directions. In most orientations of the face with respect to the rotation axis, there will be a shearing force in the $\eta_1$ direction along the face. Tensile or compressive forces are in the $\eta_2$ direction.

For some examples in this specification, a standard notation denoting elastic stresses will be used. The symbol a will denote the stress, or force per unit area of element face. The first subscript will refer to the direction of the normal to the face nearest the stress. The second subscript will refer to the direction of the force. Thus $\sigma_{22}$ will be a tensile or compressive force, and $\sigma_{21}$ will be a shear force in the $\eta_1$ direction on or near the face shown in FIG. 1*a*.

Figure 1B:
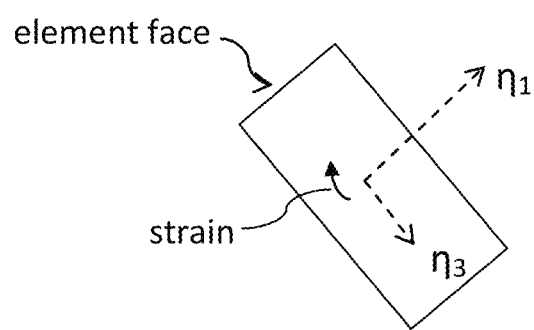
FIG. 1b shows an expanded view of FIG. 1a with a slicing plane coplanar with a face of an element, with the $\eta_1$ and $\eta_3$ axes as simply convenient local axes used to characterize the twisting shear across the face.

In FIG. 1*b*, the plane of rotation coincides with the plane containing the face. In this case there is a twisting shear in various combinations of the $\eta_1$ and $\eta_3$ directions. The $\eta_1$ and $\eta_3$ directions here can simply be parallel to two face edges or form any other convenient local coordinate system on the face. With use the notation described in the last paragraph, the twisting shear in the $\eta_3$ direction in FIB. 1*b* is $\sigma_{23}$.

IIB. Rotational Angle, Axis and Displacement

Figure 1C:
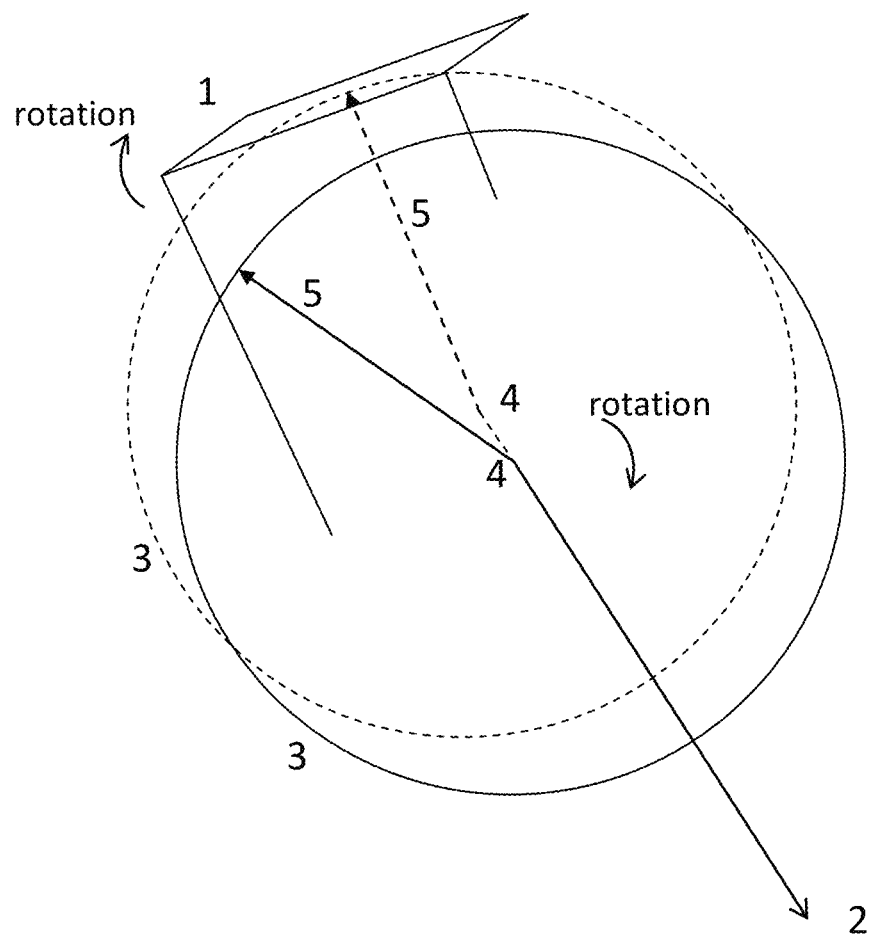
FIG. 1c shows an expanded view of FIG. 1a with two planes of rotation and with the radii of rotation where the planes intersect faces of an element.

The method comprises processor steps illustrated in FIG. 1*c* that will compute for the user elastic displacements from rotation of an element within a material matrix. The invention is not limited to elastic displacements and could calculate other physical quantities that could vary at, above or below an element face. In FIG. 1*c*, element 1, whose truncated outline is shown, undergoes a small rotation clockwise.

The processor steps can compute or receive the angle through which an element rotates in one of two ways. The steps can calculate the angle from an applied load on the ends of an element and the orientation of the element with respect to the applied load. Alternatively, the steps will allow a user to input an angle of rotation directly.

In FIG. 1*c*, element 1 rotates about a rotation axis 2. The steps will allow a user to place the rotation axis at the center of mass of the element or at any other pivot point on or inside an element. When there is a plurality of elements in a model, the steps allow a user to place a pivot point at the same place in each element or specify its position individually for each element. At a user's choosing, the steps can automatically place the rotation axis 2 perpendicular to the direction of an applied force on an element. Alternatively, the steps can allow a user to input an orientation of the rotation axis 2 directly.

In FIG. 1*c*, portions of element 1 rotate within planes of rotation 3 that are perpendicular to the rotation axis 2. Each plane of rotation can "slice" element faces or be coplanar with an element face. For a particular point of calculation on an element face, the steps compute the coordinates of an anchor of rotation 4 pertinent to the relevant plane of rotation. A vector 5 extends from the anchor of rotation 4 to a point of calculation on a face. Through a vector product between vector 5 and the rotation axis 4, the steps compute components of rotational displacement in the $\eta_1$, $\eta_2$ and $\eta_3$ directions. From these displacements, elastic stress components or other physical quantities desired by the user can be computed at a particular point on a face.

III. Initial Buildup of the Model

IIIA. Determination of Initial Edges and Vertices of One Face

Figure 2:
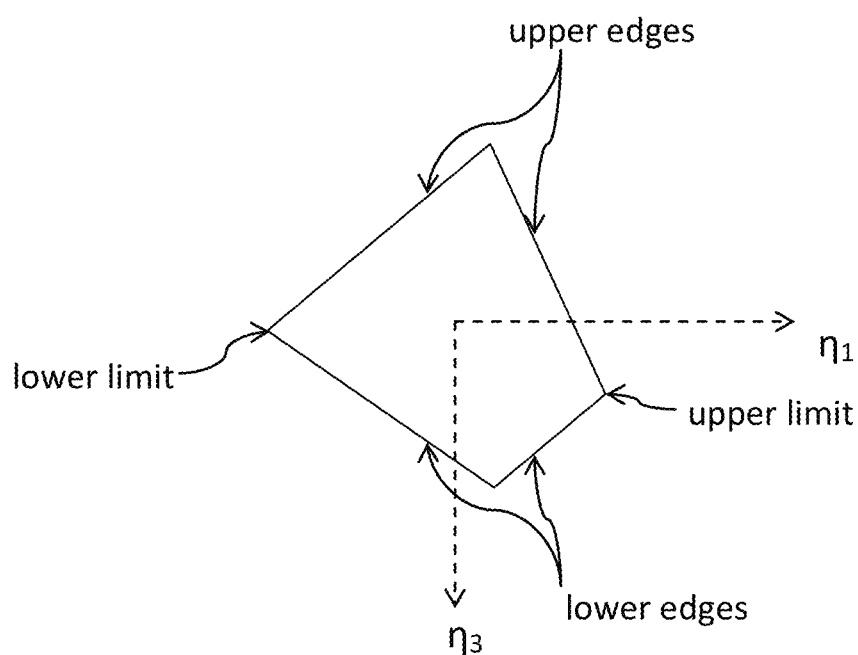
FIG. 2 shows upper edges, lower edges, an upper limit and a lower limit used in numerical integration across a face in the $\eta_1$, $\eta_3$ coordinate system.

FIG. 2 shows initial steps in a summation or integration to build the material model. FIG. 2 shows a face of an element with its $\eta_1$ and $\eta_3$ axes, as seen from an observer located along the $\eta_2$ axis. For any observer or sampling point above the plane of the face, the origin of the $\eta_1$, $\eta_2$, $\eta_3$ coordinate system is located by extending a line from the sampling point through the plane of the face and having the line perpendicular to the plane of the face. The point of intersection between the line and plane of the face is the origin of the $\eta_1$, $\eta_2$, $\eta_3$ coordinate system. For a particular observation or sampling point, upper and lower limits of integration are defined in the $\eta_1$ direction. Similarly, the upper and lower edges shown in FIG. 2 will be contained in lines having slopes $A_1$, $A_2$, $A_3$, $A_4$, . . . and intercepts $B_1$, $B_2$, $B_3$, $B_4$, . . . in this same local $\eta_1$, $\eta_3$ coordinate system.

Figure 3:
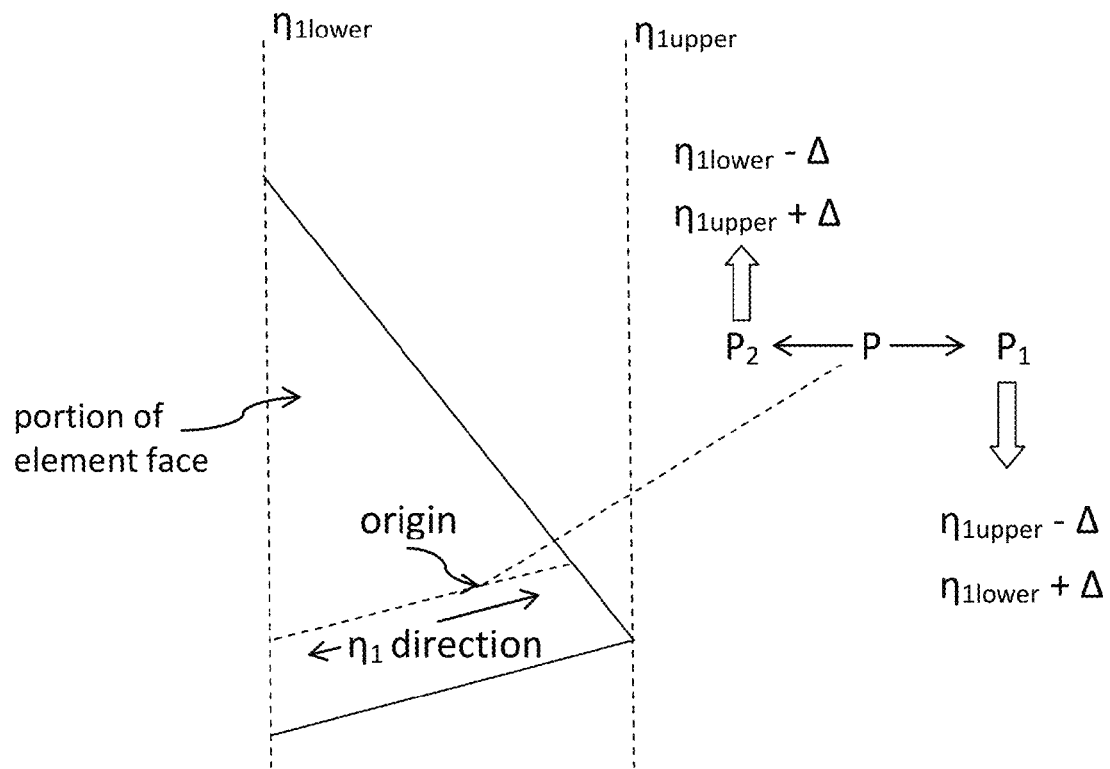
FIG. 3 shows the movement of a point P from side to side in the $\eta_1$ direction to determine limits of numerical integration to produce the desired variation of a physical characteristic calculated at P.

FIG. 3 is a schematic of the repetitive process used to determine vertices and interior angles between the edges of a face. The vertices are the limits of integration mentioned in the last paragraph. Determining the interior angles amounts to finding the slopes $A_1$, $A_2$, $A_3$, $A_4$, . . . of the edges. At any sampling point P, there will be a desired net amount of stress, potential energy, or whatever is being transmitted and measured to build the material model. The net amount can be a sum of an amount of energy at that point by design and an energy or force or other quantity that needs to be suppressed or canceled out. Since the origin of the $\eta_1$, $\eta_2$, $\eta_3$ coordinate system is particular to the point P, the limits of integration in the $\eta_1$ direction will be unique to the point P.

If the point P in FIG. 3 is moved to the right or left along the $\eta_1$ direction by a known amount $\Delta$ to points $P_1$ and $P_2$, the desired physical quantity at $P_1$ and $P_2$ will be different from that at P but will still be known. Since the origin of the $\eta_1$, $\eta_2$, $\eta_3$ coordinate system is directly beneath the point a particular sampling point, the origin will move as the point P moves. The limits of integration will therefore also move by the quantity $\Delta$, as shown in FIG. 3. P may also move to the right or left to new points $P_1$ and $P_2$ along a line segment that is above the original line segment by an amount $\Delta$ in the $\eta_3$ direction.

The variation of a physical quantity across the face in FIG. 3 is known. When a summation or numerical integration is performed along the face in the $\eta_1$ direction with estimated limits of integration, the net calculated physical quantity at point P differs as P moves. In all these instances of movement of point P, however, the quantity $\Delta$ as well as the desired physical quantity are known at all the points P, $P_1$ and $P_2$. Hence repeated movement of the point P and comparison between calculated and desired physical quantities will give an indication of the actual limits of integration and their variation along the edges of the face. This repeated operation along portions of the face will begin to indicate the position of vertices and slopes of the lines containing the edges of the face.

Although it is not explicitly shown in FIG. 3, the point P may be moved up and down in the $\eta_3$ direction along line segments perpendicular to the $\eta_1$ direction. Comparison of calculated quantities at P from summation of contributions across the face with desired quantities at P will then give an indication of slopes of other edges of the face.

IIIB. Integration and Summation Across a Face

IIIB1. Example

Equation (1) below is a quantitative representation of an integration process in FIG. 3 and in subsequent Figures. The value of $\psi$ at the point P in equation (1) can be a single numerical value or a function, depending upon whether integration can be accomplished in closed form or is done numerically. The surface S is a face of an element and r is the distance from a point on the face to the sampling point P. The subscript D depicts a disturbance which is also taken into account when optimizing a physical quantity at point P.

$$\Psi_P = \int\int_S \Psi(\eta_1, \eta_2, \eta_3, r) d\eta_1 d\eta_3 + \Psi_D \quad (1)$$

Equation (2) is an example of an integration depicted in equation (1). The quantity $\sigma_{22}$ is an elastic stress in the direction of $\eta_2$, or perpendicular to the plane of the face, and acting on a plane whose normal is in the $\eta_{12}$ direction. The integration in the $\eta_3$ direction was accomplished in closed form, leaving a numerical integration to be performed in the $\eta_1$ direction.

Equation (2) illustrates the many parameters given in FIGS. 1 through 3 that the processor steps in the invention either compute directly or help a user to determine by using the invention. In equation (2), the subscript P denotes the sampling point above or below an element face, as in FIG. 3. The subscript i refers to a component to an anchor point 4 of a radius of rotation 5 in FIG. 1*c*. The term A is a slope and the term B is an intercept of the line containing the edges of a face in FIG. 3. The subscript u refers to an upper edge in FIG. 3 and the subscript l refers to a lower edge in FIG. 3.

$$\sigma_{22} = E\varepsilon\sin\alpha(\eta_2 - \eta_{2i})\int_{\eta_{1l}}^{\eta_{1u}} \frac{(\tan^{-1}\Theta_u - \tan^{-1}\Theta_l)}{(\eta_1 - \eta_{1i})^2 + (\eta_2 - \eta_{2i})^2} \quad (2)$$

where $$\Theta_l = \frac{A_l\eta_1 + B_l - \eta_{3P}}{\sqrt{(\eta_{1i} - n_{1P})^2 + (\eta_{2i} - \eta_{2P})^2}}$$

and $$\Theta_u = \frac{A_u\eta_1 + B_u - \eta_{3P}}{\sqrt{(\eta_{1i} - n_{1P})^2 + (\eta_{2i} - \eta_{2P})^2}}$$

In equation (2) above, E is Young's Modulus, or a constant of proportionality between elastic stress and strain in a material. E is the angle of rotation described in section IIB of this Description. α is an angle between the normal to the top face and the direction of an applied load on the ends of an element.

IIIB.2 Determination of Upper and Lower Edges and Limits

If a user wants to wants to specify the size, shape and orientation of an element and perform numerical integration across a face nearest a sampling point, processor steps will detect the nearest face, set up the limits of integration and perform the integration. In a particular local coordinate system, such as the $\eta_1$, $\eta_2$, $\eta_3$ system in FIGS. 1 to 3, processor steps will first order the $\eta_1$ coordinates of the vertices in order from lowest to highest. From the $\eta_3$ coordinates, the steps determine which vertices will lie on upper edges in FIG. 2 and which on lower edges. For the upper and lower $\eta_1$ limits in FIG. 2, the steps will detect, based upon how many $\eta_3$ ordinates they have, whether the upper and lower $\eta_1$ limits have both upper and lower edges connected to them, or just one of an upper or lower edge.

IIIB.3 Integration Process

In the local coordinate system on the face, the method calculates and stores slopes A and intercepts B of lines containing each of the upper and lower edges in FIG. 2. During an integration process, the method will begin at the lower $\eta_1$ limit shown in FIG. 2, detect when an upper or lower edge changes, and continue the integration until the upper $\eta_1$ limit is reached.

IV. Buildup of the Model to a Plurality of Elements

IVA. Sphere of Analysis

Figure 4:
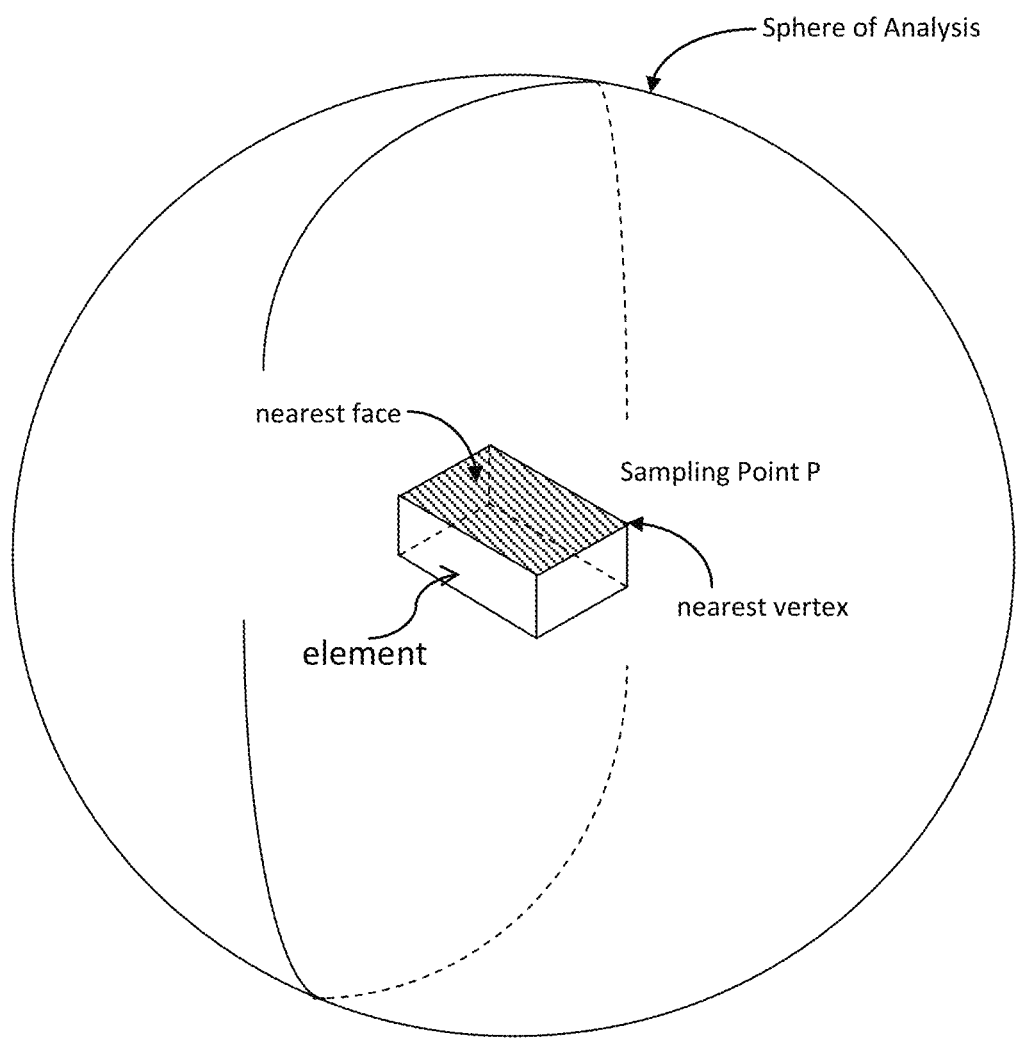
FIG. 4 shows a sampling point, its nearest vertex and face, and a sphere of analysis that contains a plurality of sampling points.

This invention also comprises other processor steps to help identify slicing planes and sampling points, and assist with summation, integration or other calculations as described in FIGS. 1 through 3 and in subsequent Figures. The processor steps comprise incrementing in radial and angular directions one or more sampling points contained within a sphere of analysis, as shown in FIG. 4. The sphere has a probe point at its center. In different embodiments of the invention, the probe point can represent a position in a wave, a crack tip, or any other central position in an entity that the user desires. The processor steps comprise identifying both the vertex and face nearest to the sampling point at hand.

IVB. Collection, Computation and Storage of Attributes

IVB.1 Basic Process

The processor and computing device first display choices for a user regarding a basic symmetry of one or more elements. Based upon this symmetry of one or more elements, the user is then appropriately prompted to enter further information regarding the shape, orientation, bundling and spacing of the elements.

The processor steps store information, as inputted by the user, and also further information about the elements that is computed by processor steps. In doing so, the processor steps do not distort, merge, subdivide, rotate or move any element away from the specifications inputted by the user. In this manner, the processor steps set up one or more elements for intricate analysis, summation or integration, as in FIGS. 3 and 4.

IVB.2 Flags

Figure 5:
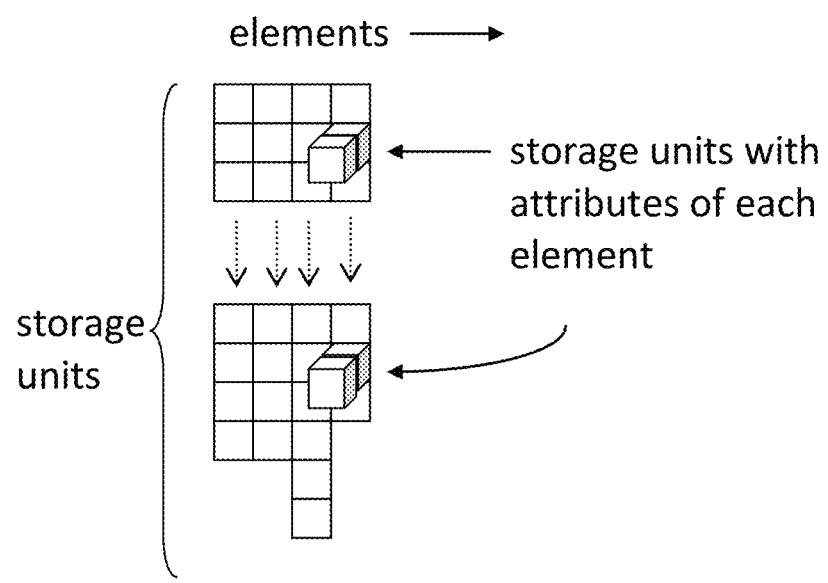
FIG. 5 is a schematic diagram of storage units that contain attributes of each element.

The steps store many flags regarding the shape of each element in a data container, such as a four dimensional vector depicted schematically in FIG. 5. For each structural element, the first data storage unit in FIG. 5 contains flags indicating the shape of that particular structural element. One flag number indicates basic symmetry of an element, which includes but is not limited to monoclinic, orthorhombic, tetragonal, hexagonal, trigonal, cubic and triclinic. For some of the symmetries, there is a second flag that denotes further information about the shape of an element. This further information comprises but is not limited to a presence of a distorted parallelepiped, presence of faces outlined by right triangles, isosceles triangles or oblique triangles, and presence of a cube or an octahedron. Yet two more flags denote a presence or absence of pyramidal endcaps and whether or not an element is tapered.

IVB.3 Variation of Force and Energy

Forces and energies may vary across a face in the $\eta_1$ and $\eta_3$ directions as well as perpendicular to a face in the $\eta_2$ direction. In what follows, an embodiment in which elastic stress varies at a face will be used to determine internal angles, orientation and spacing of three dimensional elements in the material model. The buildup of the material model is not limited to summation and integration of elastic stress, however. In other embodiments, the same process can be used to build the model when another type of force or energy varies at a face and affects a spatial region beyond the face.

IVB.4 Length and Depth of an Element

With a setup of one or more sampling points near a face with desired dimensions, a summation, integration or other calculation can be done with this method across an entire face. Movement of sampling points $P_1$ and $P_2$ backward and forward in the $\eta_2$ direction, as shown in FIG. 6, and comparison between calculated and desired quantities at these points, will give an indication of the overall lengths h and L of the faces in the material model.

IVB.5 Internal Angles

Figure 7:
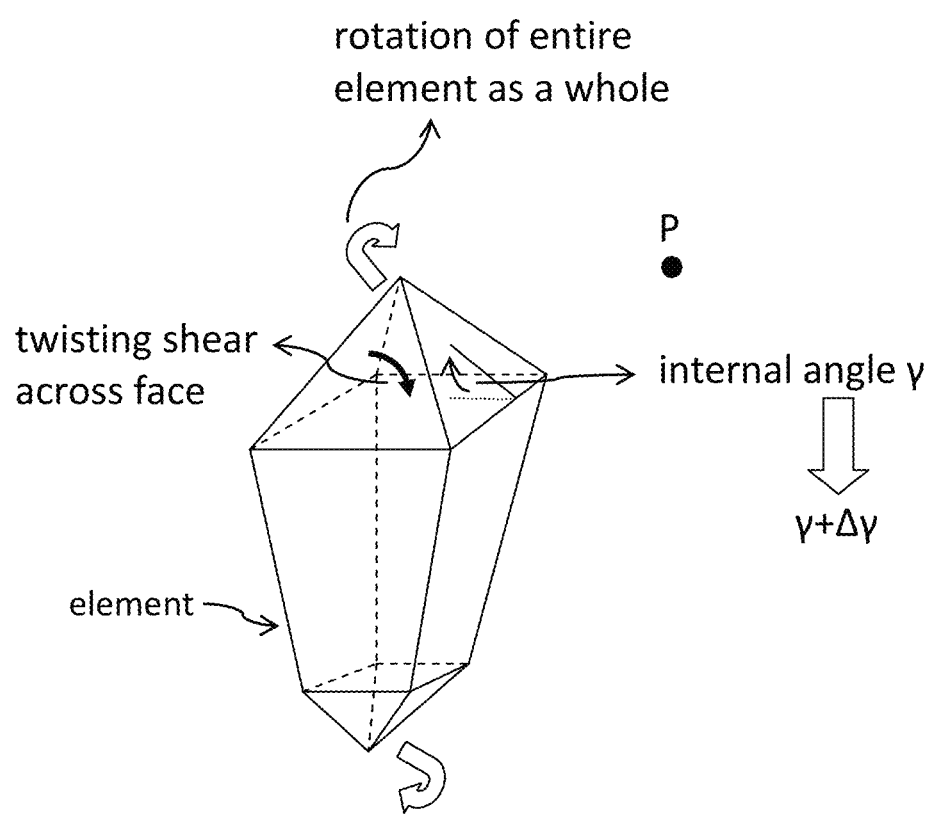
FIG. 7 shows that twisting shear across a face can vary as an element rotates in space and an internal angle $\gamma$ is varied that sets the orientation of a face.

In FIG. 7, the three dimensional element will rotate as a whole within a material matrix to produce a pattern of elastic stress. Depending upon the internal angle γ that a face makes with a reference plane and the orientation of the face, the shear displacement at the face may be of a twisting type, as shown in FIG. 7. The twisting type of shear means that the displacement can be in the $\eta_1$ direction, the $\eta_3$ direction, or a combination of both, depending upon the location of the point on the face contributing to the stress. For a given angle γ, summation or integration of contributions across the face will give independent and distinct quantities of tensile and shear stresses at a point P shown in FIG. 7. When the angle γ is changed by an amount Δγ, another set of independent and distinct quantities of tensile and shear stress at the point P will be calculated. Successive comparison of these calculated quantities of elastic stress with those desired at the point P will then indicate the internal angles of a three dimensional element in the material model.

IVB.6 Orientation of an Element

Figure 8:
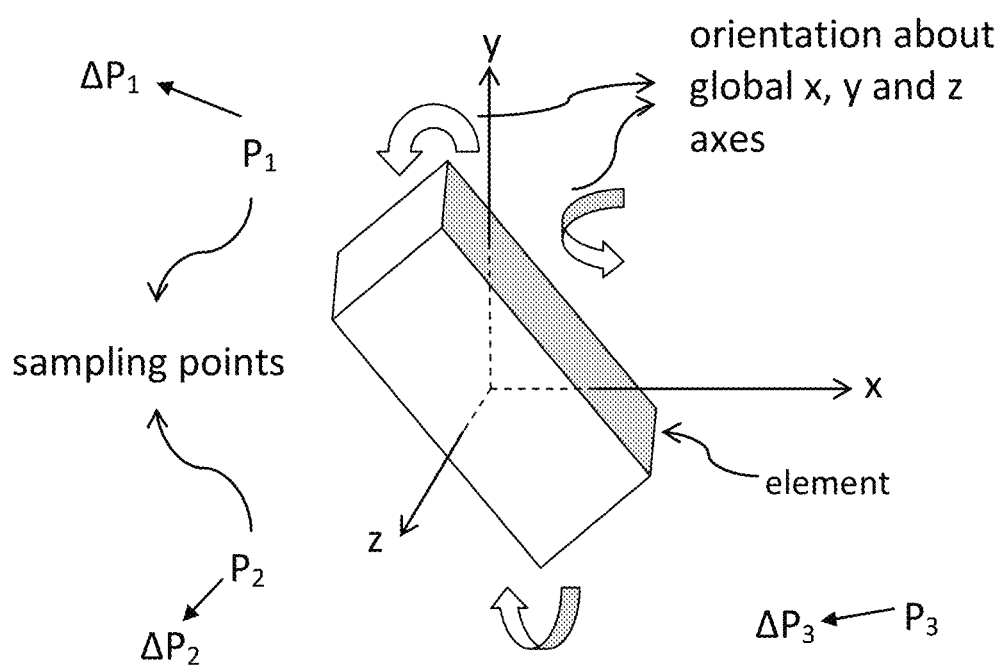
FIG. 8 shows that particular energy patterns desired at sampling points $P_1$, $P_2$, $P_3$, . . . will set the orientation of an element as a whole about the global x, y and z axes.

FIG. 8 shows sampling points used to determine the orientation of an element. The element can be oriented, for example, by rotating it about the z axis, then about the x axis and finally about the y axis. In different buildups of the model, elements might be rotated in place by rotating about axes in a different order. The pivot point can be varied as well. In different orientations, the calculated quantities at points $P_1$, $P_2$, $P_3$, ... are compared with what is desired at these points. The calculation of the physical quantity can encompass summation or integration across one or a plurality of faces of the element. Comparison of a variation in a desired physical quantity with a variation in a calculated value of the same physical quantity comprises moving any of points $P_1$, $P_2$, $P_3$, ... to new positions $\Delta P_1$, $\Delta P_2$, $\Delta P_3$, ..., wherein $\Delta P_1$, $\Delta P_2$, $\Delta P_3$, ... comprises a change Δ in one or a plurality of the coordinates of points $P_1$, $P_2$, $P_3$, ....

IVB.7 Number and Spacing of Elements

Figure 9:
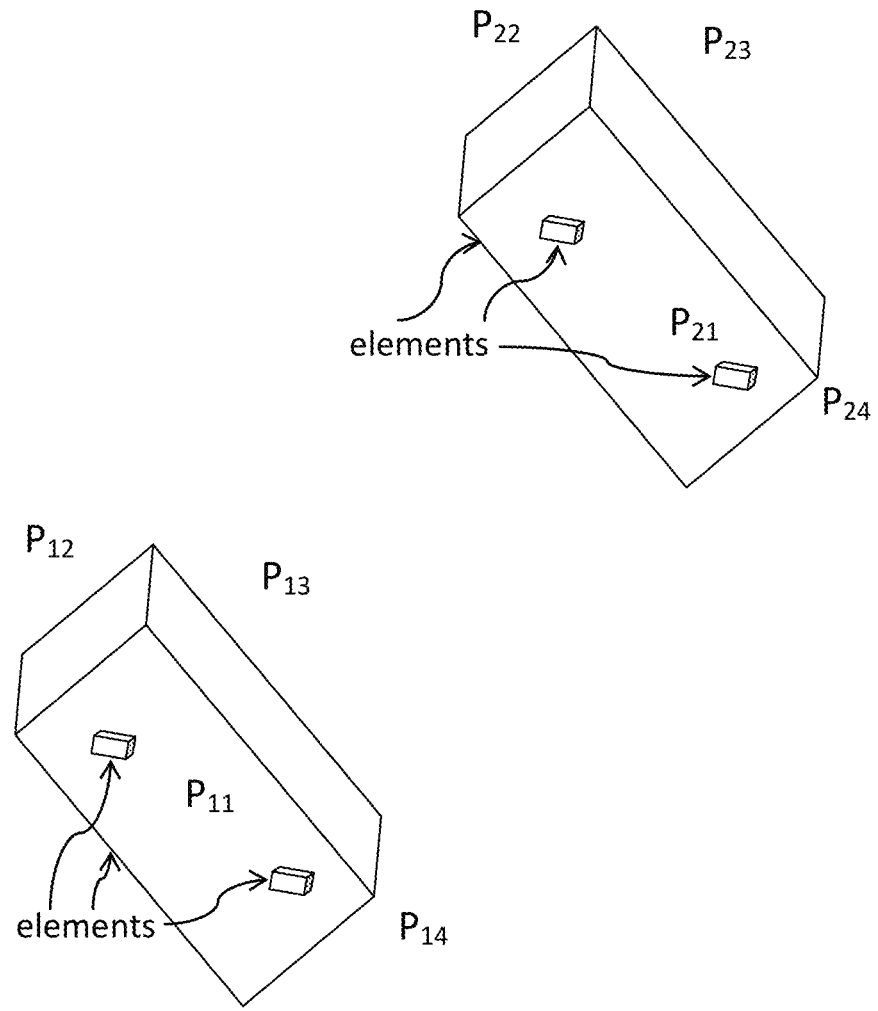
FIG. 9 shows that the repeat distance of clusters of rotating elements is determined by where sets of sampling points $P_{11}$, $P_{12}$, $P_{13}$, $P_{14}$ . . . and $P_{21}$, $P_{22}$, $P_{23}$, $P_{24}$ . . . need to be with respect to one another.

FIG. 9 shows further buildup of the model by using groups of sampling points $P_{11}$, $P_{12}$, $P_{13}$ ..., $P_{21}$, $P_{22}$, $P_{23}$ ..., $P_{31}$, $P_{32}$, $P_{33}$ .... The first group of sampling points are contained within an energy or stress pattern in which both the desired and calculated quantities arise from summation or integration agree. The energy or stress pattern arises from a one or more elements having a particular shape and orientation. By comparing this same set of desired values of energy or stress with calculated values at a next group of sampling points $P_{21}$, $P_{22}$, $P_{23}$ ..., the direction and spacing of the next rotating cluster of elements may be obtained. The process can then be repeated with a third or more groups of points until the desired energy or stress pattern in space is obtained.

The invention also comprises processor steps that aid a user in building a plurality of elements with a an orientation and spacing that will yield the desired physical quantity at each sampling point in the sphere of analysis in FIG. 4.

IVB.8 Bundling

The steps ask a user, for example, whether there will be bundling or no bundling of the structural elements. Bundling occurs when a member of a group of a structural element shares a common face with the structural element next to it. A single bundle has structural elements all of the same size and symmetry. The structural elements within a single bundle all lie along a straight line that is perpendicular to the shared faces.

An example of bundling supported by the invention is the design of a material model comprised of bundles of needle-like grains. In another example, bundling might be used to align several rectangular parallelepipeds face-to-face along a straight line. Each parallelepiped would have the same atomic arrangement about its center. Similar bundling at the atomic level with aligned octahedra is also supported by the invention.

When a plurality of bundles is desired, a user may specify whether each bundle has the same number of elements, or whether each bundle will have a number of elements that could be different from that of other bundles. For a material model, a user can specify the number of bundles, whether all the bundles have the same type of structural element, or whether one or more bundles will have a different structural element. A different structural element means that either the symmetry or the size of the elements in a particular bundle differ from that of elements in another bundle.

IVB.9 Length Scale

A user may also choose a length scale for a material model. The steps ask a user to input a number indicating whether the length scale is at the atomic, nanometer or micron length scales. Because the invention computes the results of series and closed form solutions for physical phenomena, the invention is independent of any prescribed length scale. The invention can therefore comprise length scales other than atomic, nanometer or micron levels. A user may therefore use the invention to construct a model at the continuum level as well as at the microscopic level.

IVB.9 Orientation Angles

Three orientation angles are stored in a data container depicted in FIG. 5 for each element. A user may rotate each element or bundle about the x, y and z axes in a global Cartesian coordinate system. The first orientation angle arises from rotation about the z axis that points toward the user. The second angle arises from rotation about an x axis that points to the right. The third angle arises from a twist rotation about a y axis pointing upward. The three orientation angles are stored in both radian and degree units for simple retrieval by a processor.

IVB.11 Dimensions

Dimensions for each element are also stored in a data container during the processor steps. Depending upon the symmetry of an element, a user is prompted to input specific width, depth and length dimensions, as needed. If there are pyramidal endcaps on a element, as shown in FIG. 7, a user may specify the height of the pyramid caps in terms of a percentage of the length of the main part of the element. If there is tapering, the user may specify the area the smaller face has at the end of the tapering in terms of a percentage of the area of the larger face at the other end of the element. The processor steps then compute and store the appropriate width and depth of the smaller face.

If bundling is present, a user is asked to input dimensions only once for an element in a particular bundle. Processor steps will automatically store dimensions of like structural elements within that bundle. If a user has specified that elements will have the same shape and size across all bundles, the processor steps will store the appropriate dimensions of the elements across all bundles without a need to input the information repetitively.

If any faces are outlined by oblique triangles, a user can specify a magnitude of the oblique angle in degrees. The processor steps will retain and store this angle without alteration so that a material model may be analyzed with the specified oblique angle. A user also inputs the lengths of the two shorter sides of the oblique triangle. The program computes the length of the longest side and stores the lengths of the two longer sides and the height of the oblique triangle.

IVB.12 Interior Angles

Three interior angles in degree and radian units are stored for each element in a data container shown schematically in FIG. 5. Interior angles of the structural elements are either assigned, computed and stored by processor steps, or inputted by a user. Interior angles of 90 degrees associated with orthorhombic and tetragonal shapes and with a cube, for example, are assigned and stored by processor steps. Based upon width and depth dimensions specified by a user, processor steps compute and store interior angles of triangular faces outlined by right and isosceles triangles. An interior angle less than 90 degrees is inputted by a user, for example, to form an element with monoclinic symmetry from a rectangular parallelepiped.

IVB.13 Basis Vectors

New basis vectors, as well as unit vectors in the x, y and z directions of the global Cartesian coordinate system, are used by the steps. The new basis vectors help compute direction cosines of face normals, coordinates of centroids of faces, and coordinates of vertices associated with each structural element. The new unit vectors are perpendicular to the right face, top face and front face of a rectangular parallelepiped. They stay fixed, perpendicular to the faces of this virtual parallelepiped, as a structural element is oriented in space and its internal angles specified by a user to its final orientation and symmetry. As a user orients a particular structural element in space, the virtual parallelepiped is oriented in space in the same manner with the same orientation angles. The direction cosines of the new basis vectors with respect to the global x, y and z axes are then computed and stored in a data container for each structural element, as shown schematically in FIG. 5.

IVB.14 Position of Probe Point and Location of Elements to One Another

The steps prompt a user to designate a main element or bundle. A user is then prompted for coordinates of the virtual center-of-mass of each unbundled element or each bundle relative to this main structural element or bundle, respectively. In this manner, the steps help a user build multiple elements into a model when clusters of sampling points are being analyzed, as shown schematically in FIG. 9.

The steps also prompt a user for an initial position of a probe point relative to the main structural element. The probe point is the center of the sphere in FIG. 4. When the elements are either unbundled or bundled, the steps then compute and store in a data container the location of each element with respect to the probe point and also with respect to every other structural element. When there is bundling, the steps also compute and store the location of the center of each bundle with respect to the probe point, the location of each element with respect to the center of the bundle in which it resides, and the coordinates of the center of every bundle with respect to the center of every other bundle.

IVB.15 Radius of Interaction

Figure 10:
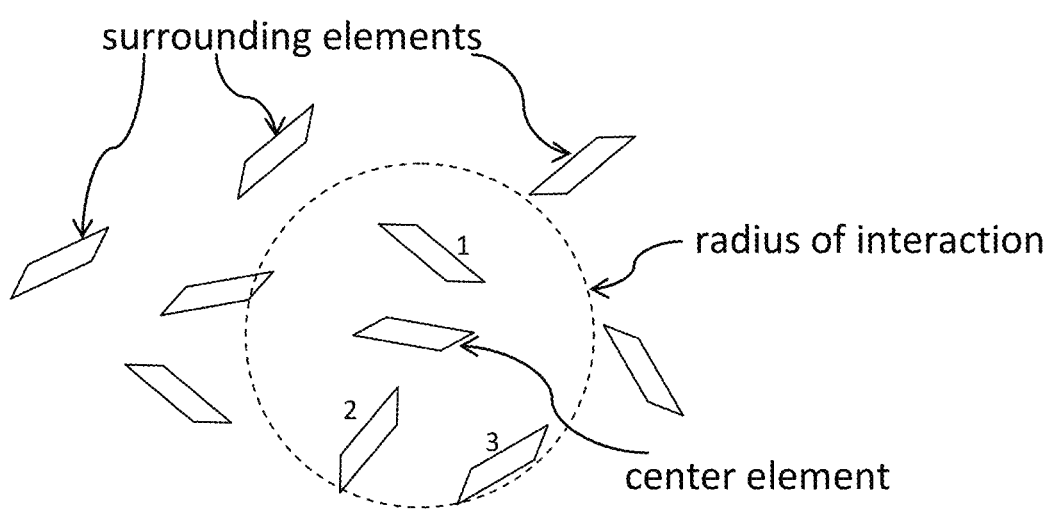
FIG. 10 shows a radius of interaction with a element at its center and ordering of interacting elements by distance

A user also inputs a radius of interaction around each element, as shown in FIG. 10. The radius of interaction is a radius of a virtual sphere that has its center around each structural element or bundle. Other elements or bundles whose centers are located within the radius of interaction around a particular structural element or bundle can interact with the structural element at the center of the sphere.

The type of interaction is set by a user by formulae placed into the processor steps. For each element or bundle, however, processor steps automatically identify any interacting elements or bundles, respectively. The steps then store in a data container the coordinates of interacting elements or bundles with respect to a particular structural element or bundle in order 1, 2, 3 . . . of distance from nearest to farthest interacting element or bundle.

V. Flux Vectors

The three dimensional elements in FIGS. 1 to 10 might be material micro structural elements themselves, such as grains, or simply a three dimensional shape with entities such as atoms at the vertices. The three dimensional elements may also be a shape or guide of a path of energy.

In one embodiment, for example, a material model is any grouping of atoms, grains, particles, material phases, bimaterial interfaces or texture represented by flux vectors. The flux vector has a magnitude of force, kinetic energy, potential energy or any other energy and a direction normal to a unit area through which the force or energy transmits or changes magnitude. The rearrangement of flux vectors in the invention here can utilize or emit electromagnetic waves. The path and configuration of the flux vectors may also be defined by the shape of the surface normal to the path of the flux vectors.

Figure 11:
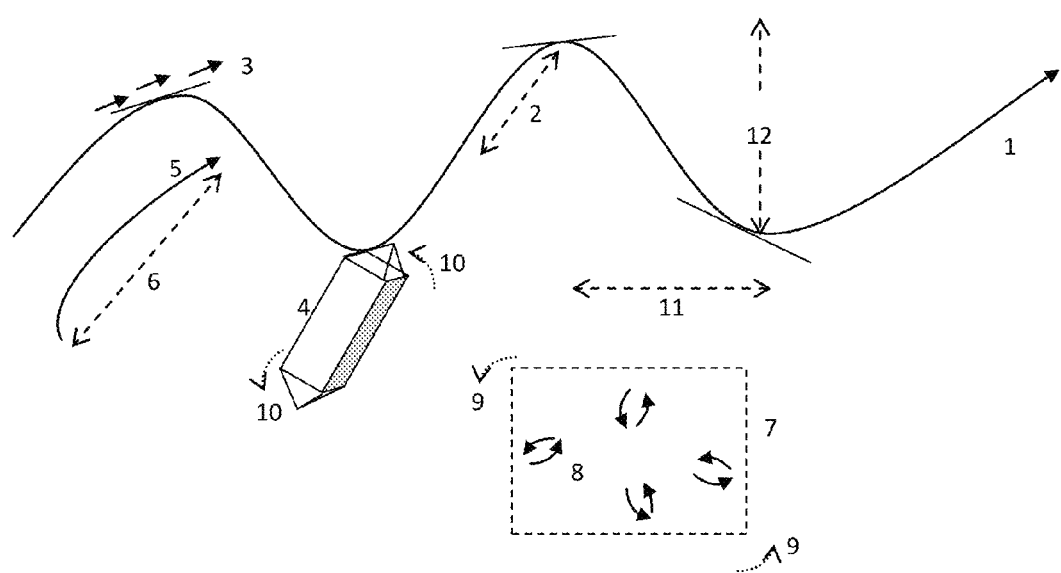
FIG. 11 shows the path of energy through micro structural elements when both the energy and micro structural elements are modeled as energy flux vectors.

A path of flux vectors 1, as shown in FIG. 11, could represent an electric energy potential that relies upon the shape of this path and its curvature rather than a traditional voltage. The energy flux is defined by the energy flowing or changing in magnitude per unit area per unit time in the direction of path 1.

The faces of one or more three dimensional elements in FIGS. 1 through 10 can be parallel or perpendicular to a path of flux vectors. A rotation of one or more elements then comprises a change in direction of a path of flux vectors. A method of obtaining a desired flux at one or more sampling points in FIGS. 1 through 10 can comprise summation or integration, but it can also comprise an alteration of a path at one sampling point to be energetically favorable with a rotation of an element or change in path of another group of flux vectors.

In various embodiments of the invention, Path 1 is kept to a shape and curvature 2 that optimizes a property comprising electrical energy, strain energy, mechanical energy or a force for a device. A higher electrical potential could occur, for example, where path 1 is relatively straight compared with regions where path 1 is more curved. Path 1 could be kept nearly straight, for example, by maximizing the number of points where the curvature is zero of a single sine function describing its shape, or by maximizing the number of arcs and segments where a sum of sine and cosine functions yields an arc of little curvature.

Path 1, or a surface normal to Path 1 in FIG. 11, can be kept to an optimum direction and curvature by keeping its energy flux vectors compatible in direction with the energy flux vectors 3 of an elastic stress pattern in the material. The energy flux vectors of an elastic stress pattern, for example, may be at the interface of one micro structural element 4 and the matrix material or anywhere in the matrix material 3. The energy flux vectors of Path 1, as well as those at the stress patterns 3 and 4, are kept at an optimum direction and curvature so as to eliminate or minimize the effect of a disturbance 5 whose energy flux have their own path of curvature 6.

Path 1 in FIG. 11 may also be kept to an optimum direction and curvature by aligning its flux vectors in a favorable manner with those of a cluster 7 of smaller elements, each having their own flux vectors 8. Each cluster 7 might rotate elastically 9 to change the direction and phase of the path the flux vectors both within and outside the cluster. Rotation 10 might also occur with a larger micro structural element 4 to change the path of the energy flux vectors inside and outside the element.

Vector functions that could describe the shape of paths 1, 3, 5 and 8, or the surfaces normal to these paths, in an x, y, z coordinate system can comprise a sum of linear and trigonometric functions as the coefficient of each unit vector in the x, y and z directions, respectively. Paths 1, 3, 8 and 8 in three dimensions can therefore be knotlike, a single sinusoidal wave, a single closed loop, or nearly a straight line in a single direction. The flux vectors of paths 1, 3, 5 and 8 can become favorably aligned by altering either the frequencies, phase angles, or the amplitudes of the trigonometric functions just mentioned that describe the shape of the path of the flux vectors. The invention is not limited to describing the shape of paths of flux vectors with trigonometric functions in an x, y z coordinate system. In other embodiments, the shape of a path or a surface through which flux vectors pass could be described in another coordinate system with another mathematical construct.

A rearrangement of a mathematical expression for the path of the flux vectors by frequency, phase angle or amplitude can occur over a length 11 that is characteristic of path 1. It can also occur over a larger length 12 between particular elements 4 or material phases whose volume fraction is defined by the length 12.

A material model is built first by assigning the desired shape of the path of force or energy of the property of interest. Material elements are then added so that their energy flux vectors, upon rotation of the elements, guide or encapsulate the first set of energy flux vectors so that they remain in their desired configuration, even in the presence of yet a third set of energy flux vectors arising from a disturbance to the property of interest. The guidance or encapsulation of the shape of the path may be effected by a rotation of three dimensional elements which comprises a change in an amplitude $A_i$, a frequency $\omega_i$ or a phase $\psi_i$ in trigonometric functions that are the coefficients with i equal to 1, 2, 3, 4, . . . of a total vector function describing the path or surface normal to the path. With a plurality of elements, the amplitudes $A_i$, frequencies $\omega_i$ and phase angles $\psi_i$ can vary spatially from one point to another with a material model.

Equation (3) shows one expression of a mathematical function $\psi$ that could describe any of the paths 1, 5 or 8 in FIG. 11. The i, j and k directions for the unit vectors are three directions in an orthogonal coordinate system. Equation (3) shows the amplitudes A, frequencies $\omega$ and phase angles that could change value to alter an entire pattern of flux vectors to a configuration with lower energy.

$$\Phi = \hat{i} \sum_{p=1}^{N_1} [A_{1p}\sin(\omega_p t + \phi_p) + A_{2p}\cos(\omega_p t + \phi_p)] + \quad (3)$$

$$\hat{j} \sum_{q=1}^{N_2} [B_{1q}\sin(\omega_q t + \phi_q) + B_{2q}\cos(\omega_q t + \phi_q)] +$$

$$\hat{k} \sum_{s=1}^{N_3} [C_{1s}\sin(\omega_s t + \phi_s) + C_{2p}\cos(\omega_s t + \phi_s)]$$

To determine whether a change in a pattern of flux vectors varying across or emanating from an element face affect another pattern at a sampling point P, a difference function shown in Equation (4) could be computed and integrated by the invention.

$$\int\int_S (\Phi_P - \Phi_S) d\eta_1 d\eta_3 \quad (4)$$

Since the function $\psi$ in equation (4) could be a vector function as in equation (3), the function can be separated into $\eta_1$, $\eta_2$ and $\eta_3$ components before integration or summation, as shown in equation (5).

$$\int\int_S (\Phi_{P1} - \Phi_{S1}) d\eta_1 d\eta_3 + \quad (5)$$
$$\int\int_S (\Phi_{P2} - \Phi_{S2}) d\eta_1 d\eta_3 + \int\int_S (\Phi_{P3} - \Phi_{S3}) d\eta_1 d\eta_3$$

VI. Further Embodiments

The method supports many embodiments of a material model, some of which are mentioned here. In one example arising from flux vectors depicted in FIG. 11, a form of electrical energy is induced and maintained that differs from a traditional voltage between positive and negative charges. To build such a model, steps described previously in this description and as depicted in FIGS. 1 through 11 would be used. The desired physical quantity could comprise an electric potential or a particular shape of a wavelike characteristic of a charge carrier. Flux vectors would be placed along or emanating from one or more three dimensional elements that rotate. The shape and arrangement of the three dimensional elements would be determined by keeping an electrical potential or wave shape intact, even when a potential disruption among flux vectors could arise from a material boundary or thermal vibration.

Figure 12:
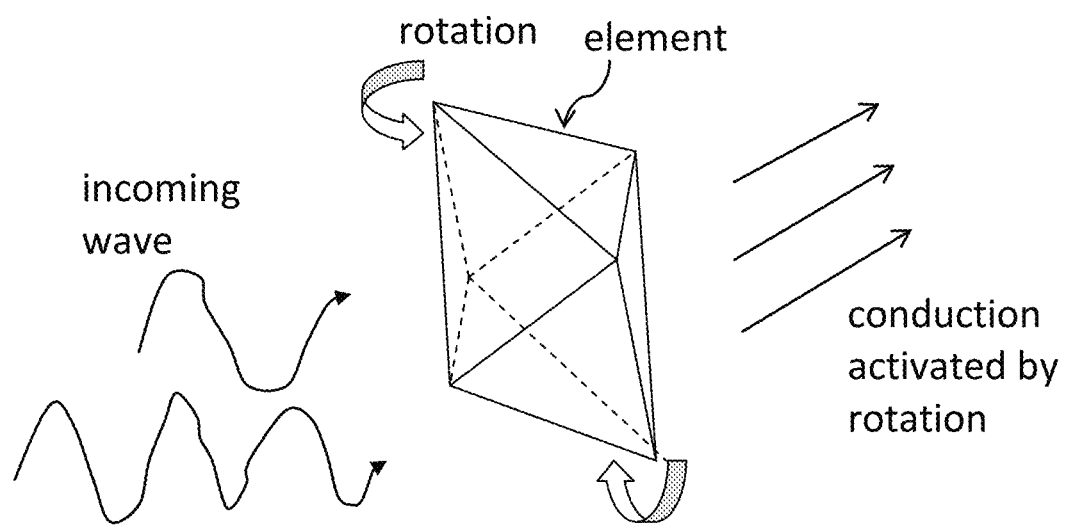
FIG. 12 shows an element with a shape and orientation to promote electrical conduction when an incoming wave affects the rotation of the element.

In another embodiment of the invention, as shown in FIG. 12, a set flux vectors in a particular configuration interacts with incoming electromagnetic radiation and can identify properties comprising frequency and incoming direction of the radiation. In this instance, the desired physical quantity in the steps comprising those in FIGS. 1 through 11 is an arrangement of flux vectors on or inside three dimensional elements that rotate to indicate the incoming direction of a wave and oscillate with the frequency of the incoming wave.

Figure 13:
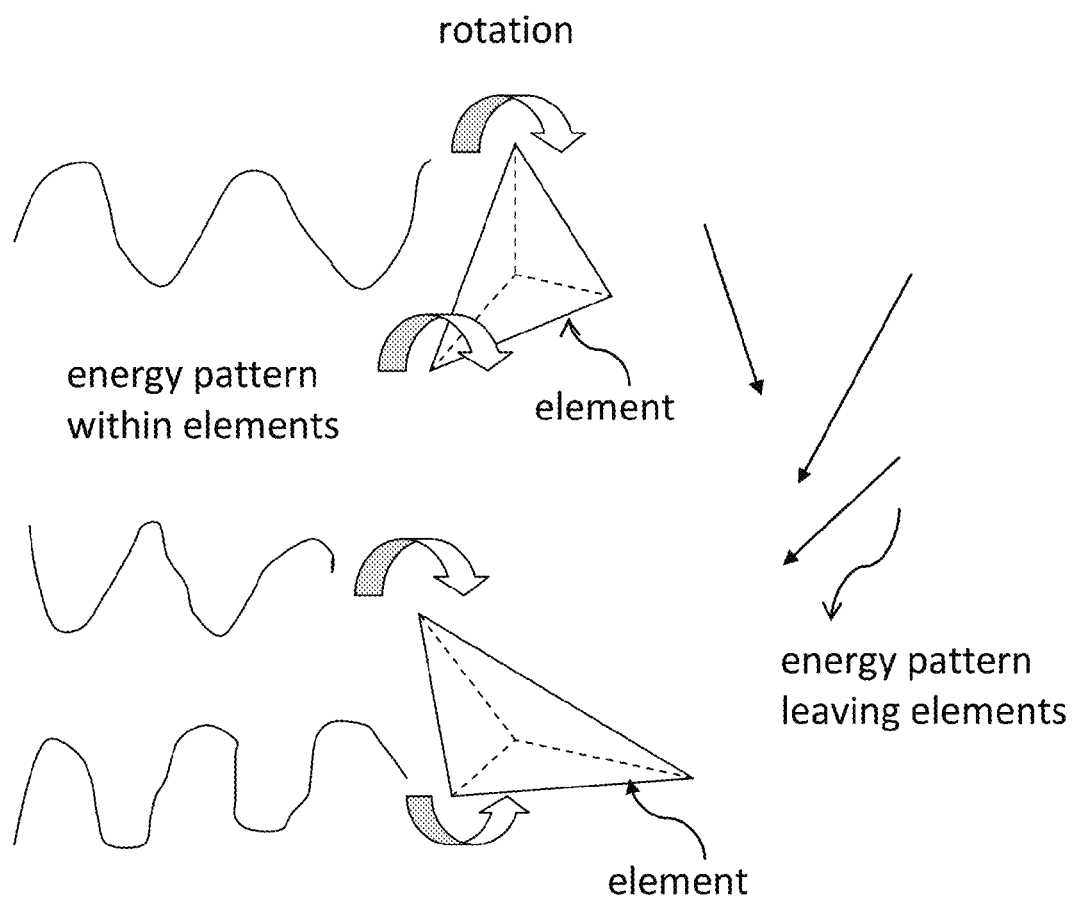
FIG. 13 shows elements with a shape and orientation to promote a particular energy pattern leaving a region of rotating elements.

In a third embodiment of the invention, as shown in FIG. 13, a set of flux vectors of a particular configuration separates and travels as a distinct signal from the material. To build this material model, flux vectors would be arranged inside or on elements that rotate such that the arrangement become stable when it releases flux vectors in a particular arrangement. In yet a fourth embodiment of the invention, the flux vectors either inside or emanating from a material are configured to promote the selective separation of two or more other elements.

VII. Development of Further Embodiments

Figure 14:
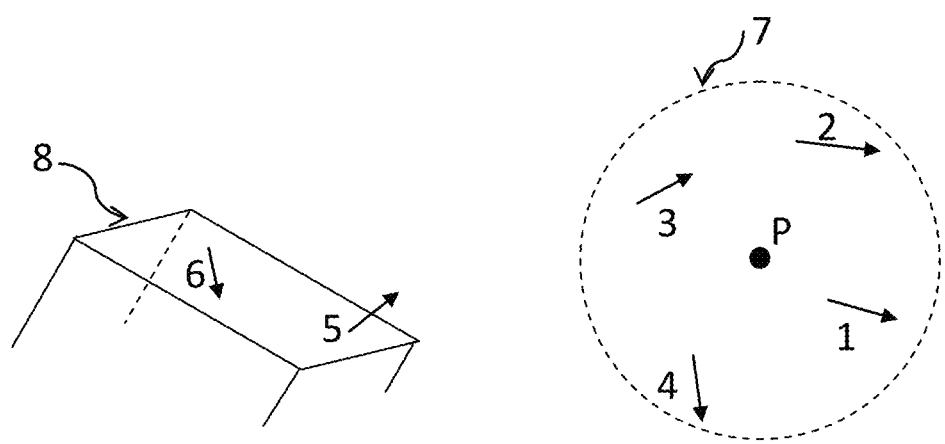
FIG. 14 shows a sampling of flux vectors about a point P and at an element face that are used to characterize functions that describe a path for the flux vectors.

FIG. 14 illustrates processor steps that can be included in the method to speed the development of further embodiments for which the method might be used. Whether or not there will be an alteration of flux vectors at or near a sampling point P in FIG. 14 can be determined by associating a set of numbers with each flux vector. The set of numbers, for example, could be values of amplitude, frequency and phase angle in equation (3) for a function depicting a path of a flux vector. Each flux vector 1, 2, 3, 4, 5 and 6 in FIG. 7 would have its own set of numbers.

A similar set of numbers would be associated with a flux vector at a point P. Sampling to compare sets of numbers between any or all pairs of numbers at flux vectors 1, 2, 3, 4, 5 and 6 in FIG. 14 and at point P could occur within a sphere 7 about point P or across a face of an element 8 in FIG. 14. A criterion can be set for stability or instability based upon one or more differences between values in amplitude, frequency, phase angle, or whatever characteristics the number values represent. If an instability is detected, the value of the numbers, and hence a magnitude or direction of one or more flux vectors would be altered until a criterion of stability is reached.

Since the flux vectors vary across faces of elements or emanate from faces of elements, altering a set of numbers becomes equivalent to altering the length and orientation of edges of an element containing any plurality of the vectors. In altering the sets of numbers, therefore, the shape, orientation and spacing of element 8 in FIG. 14 and any other elements not pictured are adjusted accordingly until a stable material model is attained.

| Citations | |
|---|---|
| Patent Number | Inventor(s) |
| US 8,699,249 | Chen, Ping |
| US 8,679,373 | Nagel, Christopher J. |
| US 8,643,280 | Heil, Brian George, et. al. |
| US 8,629,572 | Phillips, Reed E. |
| US 8,582,397 | Rhaghavan, Raghu and Poston, Timothy |
| US 8,426,077 | Norby, Truls, et. al. |
| US 8,124,966 | Lazarov, Pavel I. |
| US 8,119,571 | Goyal, Amit |
| US 8,097,456 | Borenstein, Jeffrey P., Carter, David and Vacanti, Joseph P. |
| US 8,093,786 | Shi, Yong and Xu, Shiyou |
| US 7,576,353 | Diduck, Quentin and Margala, Martin |
| US 7,813,160 | Drndic, Marija and Fischbein, Michael D. |
| US 7,499,841 | Hoffman, Edward L. |
| US 7,493,243 | Choi, Min Guy and Ko, Hyeong Seok |
| US 7,403,879 | Placko, Dominique Marc, et. al. |
| US 7,363,198 | Balaniuk, Remis, et. al. |
| US 6,847,925 | Ottusch, John Jacob, et. al. |
| US 5,768,156 | Tautges, et. al. |
| Patent Application Number | Inventor(s) |
| US 2014/0278294 | Yeager, Larry F., et. al. |
| US 2014/0194051 | Croft, Brian L. |
| US 2014/0125663 | Zhang, et. al. |
| US 2013/0311450 | Ramani, et. al. |
| US 2009/0315885 | Baszucki, David B. |
| US 2009/0102837 | Kang, et. al. |
| US 2006/0111887 | Takeuchi, Kazuhiro and Nagakura, Masahiro |

What is claimed:

1. A method steps to be performed on or by means of a computing device comprising a processor and memory, with the steps comprising:
    (a) receiving from a user information comprising presence or absence of bundling and how many elements or bundles, wherein said elements are three dimensional, enclosed by planar faces, and are parts of a model of a monolithic micro structure;
    (b) in accordance with step (a), receiving from a user information further comprising whether or not a plurality of unbundled elements all have the same shape, size, and orientation, whether or not a plurality of bundles will all have the same number of elements and orientation, and whether or not a plurality of bundles will all have elements of the same size and shape;
    (c) in accordance with steps (a) and (b), receiving from a user for each element information further comprising symmetry, presence or absence of tapering, and presence or absence of pyramidal endcaps;
    (d) in accordance with steps (a) through (c), receiving from a user information further comprising width, depth, length, orientation, spacing, interior angles, height of pyramidal endcaps, a position of a pivot point on each element or bundle, orientation of a rotation axis at said pivot point, magnitude of rotation about said rotation axis, and an amount of tapering further comprising an area of one end face that is a percentage of the area of the other end face;
    (e) for each face of each element, in a coordinate system comprising an axis perpendicular to a plane containing the face, and comprising another axis in said plane of the face and perpendicular to a rotation axis of the element containing the face, checking values of abscissas and ordinates of vertices to determine which values are upper and lower limits of integration, and which values connect upper edges, lower edges, or both as limits of integration;
    (f) across one or more faces or within a radius about a sampling point, performing any one or more of a summation, difference, integration, computation and alteration of any one or more of scalars, components of a tensor of order of one or more, components of a rotational displacement, and functions of one or more variables;
    (g) comparing values from step (f) at one or more sampling points with desired values of a physical quantity, wherein said desired values are calculated with any one or more of scalars, components of a tensor of order of one or more and functions of one or more variables;
    (h) in accordance with steps (a) through (g), altering any of one or more of shape, orientation and spacing of one or more elements until a model yields said desired values of one or more physical quantities at one or more sampling points.

2. A micro structure having a model that can be built by a method of steps, with the steps comprising:
    (a) receiving from a user information comprising presence or absence of bundling and how many elements or bundles, wherein said elements are three dimensional, enclosed by planar faces, and are parts of a model of a monolithic micro structure;
    (b) in accordance with step (a), receiving from a user information further comprising whether or not a plurality of unbundled elements all have the same shape, size, and orientation, whether or not a plurality of bundles will all have the same number of elements and orientation, and whether or not a plurality of bundles will all have elements of the same size and shape;
    (c) in accordance with steps (a) and (b), receiving from a user for each element information further comprising symmetry, presence or absence of tapering, and presence or absence of pyramidal endcaps;
    (d) in accordance with steps (a) through (c), receiving from a user information further comprising width, depth, length, orientation, spacing, interior angles, height of pyramidal endcaps, a position of a pivot point on each element or bundle, orientation of a rotation axis at said pivot point, magnitude of rotation about said rotation axis, and an amount of tapering further comprising an area of one end face that is a percentage of the area of the other end face;

(e) for each face of each element, in a coordinate system comprising an axis perpendicular to a plane containing the face, and comprising another axis in said plane of the face and perpendicular to a rotation axis of the element containing the face, checking values of abscissas and ordinates of vertices to determine which values are upper and lower limits of integration, and which values connect upper edges, lower edges, or both as limits of integration;

(f) across one or more faces or within a radius about a sampling point, performing any one or more of a summation, difference, integration, computation and alteration of any one or more of scalars, components of a tensor of order of one or more, components of a rotational displacement, and functions of one or more variables;

(g) comparing values from step (f) at one or more sampling points with desired values of a physical quantity, wherein said desired values are calculated with any one or more of scalars, components of a tensor of order of one or more and functions of one or more variables;

(h) in accordance with steps (a) through (g), altering any of one or more of shape, orientation and spacing of one or more elements until a model yields said desired values of one or more physical quantities at one or more sampling points.

* * * * *